US010560781B2

(12) United States Patent
Anderson et al.

(10) Patent No.: US 10,560,781 B2
(45) Date of Patent: Feb. 11, 2020

(54) SYSTEMS AND METHODS FOR CONTROLLING PLATE LOUDSPEAKERS USING MODAL CROSSOVER NETWORKS

(71) Applicant: UNIVERSITY OF ROCHESTER, Rochester, NY (US)

(72) Inventors: David Allan Anderson, Rochester, NY (US); Mark F. Bocko, Caledonia, NY (US)

(73) Assignee: UNIVERSITY OF ROCHESTER, Rochester, NY (US)

( * ) Notice: Subject to any disclaimer, the term of this patent is extended or adjusted under 35 U.S.C. 154(b) by 0 days.

(21) Appl. No.: 15/753,679

(22) PCT Filed: Aug. 19, 2016

(86) PCT No.: PCT/US2016/047768

§ 371 (c)(1),
(2) Date: Feb. 20, 2018

(87) PCT Pub. No.: WO2017/031422

PCT Pub. Date: Feb. 23, 2017

(65) Prior Publication Data

US 2019/0007772 A1 Jan. 3, 2019

Related U.S. Application Data

(60) Provisional application No. 62/207,690, filed on Aug. 20, 2015.

(51) Int. Cl.
*H04R 27/00* (2006.01)
*H03G 3/20* (2006.01)
(Continued)

(52) U.S. Cl.
CPC ................ *H04R 3/14* (2013.01); *H04R 3/04* (2013.01); *H04R 7/045* (2013.01); *H04R 9/06* (2013.01); *H04R 17/00* (2013.01)

(58) Field of Classification Search
CPC .......... H04R 3/12; H04R 1/403; H04R 27/00; H04R 1/323; H04R 29/007; H04R 1/24; H04R 3/14
(Continued)

(56) References Cited

U.S. PATENT DOCUMENTS 4,328,569 A * 5/1982 Trott ...................... G10K 11/26 367/103
5,533,132 A * 7/1996 Button ................... H04R 1/028 181/199

(Continued)

FOREIGN PATENT DOCUMENTS

WO 97/09842 A2 3/1997
WO 00/33612 A2 6/2000

(Continued)

OTHER PUBLICATIONS

International Preliminary Report on Patentability dated Mar. 1, 2018, from International Application No. PCT/J82016/047768, 8 pages.

(Continued)

*Primary Examiner* — George C Monikang
(74) *Attorney, Agent, or Firm* — Ping Wang; Morris, Manning & Martin, LLP

(57) ABSTRACT

Systems and methods of driving plate loudspeakers with different parameters based on frequency region in a way similar to typical cone driver crossover networks are described. These systems and methods may be implemented using arrays of independently controlled drivers which allow a designer to emphasize or de-emphasize certain modes in certain frequency bands. Tuning the characteristics of the plate's motion can also affect the acoustical properties in a larger space rather than just at a single location. The systems and methods described herein can grant a designer a degree
(Continued)

of control over the characteristics and performance of the plate.

21 Claims, 9 Drawing Sheets

(51) Int. Cl.

| | |
|---|---|
| ***H04R 3/14*** | (2006.01) |
| ***H04R 7/04*** | (2006.01) |
| ***H04R 3/04*** | (2006.01) |
| ***H04R 9/06*** | (2006.01) |
| ***H04R 17/00*** | (2006.01) |

(58) Field of Classification Search
USPC ................................ 381/59, 77, 82, 104, 107
See application file for complete search history.

(56) References Cited

U.S. PATENT DOCUMENTS

| | | | | |
|---|---|---|---|---|
| 6,104,817 | A * | 8/2000 | Ding | H04R 3/00 381/96 |
| 2004/0240697 | A1* | 12/2004 | Keele, Jr. | H04R 1/403 381/336 |
| 2005/0013453 | A1 | 1/2005 | Cheung | |
| 2009/0060245 | A1* | 3/2009 | Blanchard | H04R 3/14 381/345 |
| 2011/0062888 | A1* | 3/2011 | Bondy | H05B 33/0815 315/294 |
| 2012/0033837 | A1* | 2/2012 | Mitsui | H04R 1/005 381/191 |
| 2015/0086048 | A1* | 3/2015 | Brown | H04R 1/02 381/152 |
| 2016/0073215 | A1* | 3/2016 | De Bruijn | H04S 7/308 381/17 |
| 2016/0119712 | A1* | 4/2016 | Tzirkel-Hancock | H04R 1/406 381/86 |

FOREIGN PATENT DOCUMENTS

| | | |
|---|---|---|
| WO | 02/13574 A2 | 2/2002 |
| WO | 2008/090077 | 7/2008 |
| WO | 2015/119612 | 8/2015 |

OTHER PUBLICATIONS

International Preliminary Report on Patentability dated Jun. 7, 2018, from related International Application No. PCT/US2016/063121, 10 pages.

Anderson, D. et al. "A Model for the Impulse Response of Distributed-Mode Loudspeakers and Multi-Actuator Panels", AES Convention 139, Oct. 2015, 10 pages.

International Search Report and Written Opinion dated Nov. 15, 2016, from International Application No. PCT/US2016/047768, 10 pages.

* cited by examiner

SYSTEMS AND METHODS FOR CONTROLLING PLATE LOUDSPEAKERS USING MODAL CROSSOVER NETWORKS

CROSS-REFERENCE TO RELATED APPLICATIONS

This is a national stage application of PCT/US2016/047768, filed Aug. 19, 2016, which claims priority to, and the benefit of, U.S. Provisional Application No. 62/207,690, filed Aug. 20, 2015, titled "SYSTEMS AND METHODS FOR CONTROLLING PLATE LOUDSPEAKERS USING MODAL CROSSOVER NETWORKS," each of which is incorporated by reference herein in its entirety.

BACKGROUND

The size and weight of cone loudspeakers can be a bottleneck for thin, light electronics. Loudspeakers that rely on the bending motion of a stiff plate to produce acoustic radiation have been proposed as an alternative to traditional designs for nearly a century. A plate whose vibration is actuated by an electromagnetic coil driver or piezoelectric bending device, known as a "Distributed" or "Diffuse" Mode Loudspeaker (DML) because of the way it vibrates in complex combinations of resonant modes, can have some promising acoustic characteristics. However, it has not become as widespread as the ubiquitous cone loudspeaker. Despite the fact that thin, lightweight plates have the potential to be integrated into many more spaces than heavy, bulky cone loudspeakers, they can suffer from weak and reverberant bass response and may be regarded as poor for hi-fidelity audio applications.

An investigation of mechanical impedance matching between drivers and plates and plate radiation efficiency and plate frequency response characteristics can show that plates can be suitable for use as a source of audio reproduction. Plates can have relatively omnidirectional radiation patterns over the audio band due to their complex and spatially complex vibrational characteristics. However, plate loudspeakers can suffer from temporal (equivalently phase) distortions caused by the spread of initially localized driving forces across the entire surface of the plate, since construction can involve the use of a single small driver to actuate the panel. Temporal distortion has been shown to affect hi-fidelity audio reproduction, especially in speech applications. The temporal response issues can distort high amplitude transients in music and speech when plates ring at their resonant frequencies. Moreover, the Speech Transmission Index of a traditional single driver DML can be considerably lower than that of traditional loudspeakers, which can make them less ideal for critical audio reproduction.

The weak bass and reverberation effects can be somewhat compensated for by using equalization and digital inverse filters. However, the spatial diffusion properties mentioned earlier can cause inverse filtering to work only at select spatial points in the radiation zone of the plate, a result which may mean little for loudspeakers meant to reproduce audio over a large area. Materials with high internal damping, meant to decrease reverberation, also can have the effect of causing weak bass response.

Therefore, what are needed are devices, systems and methods that overcome challenges in the present art, some of which are described above.

SUMMARY

Plate loudspeakers can present a convenient way to integrate audio into devices or spaces where form factor is significant, but their sound can usually be characterized by weak and reverberant bass response. Moreover, this problem may not be easily fixed with equalization or inverse filtering due to the spatially diffuse nature of the acoustic radiation. The mechanics and acoustics of plates driven by audio signals can be decomposed and analyzed using the same principles as linear time-invariant (LTI) systems, allowing for electrical systems to compensate for mechanical shortcomings. Described herein is an electrical backend control system to extensively tune the acoustic response of plates called a "modal crossover network." The disclosed scheme uses an array of independently controlled drivers in order to better control the characteristics of the plate. The input signal is first passed through a traditional crossover network designed to separate the signal into multiple frequency bands. Each band is passed through a "spatial filter," which assigns the relative amplitude of each driver for that band. The frequency response and transient characteristics of the plate can be designed to sound much better for sonic reproduction using such a system than a plate driven by other, conventional means.

Thus, in one aspect of the disclosure, crossover networks can be implemented with arrays of independently controlled drivers to allow for great flexibility in tuning the mechanical response of a plate. This can allow it to work well, for example, with music and speech signals. Simulations can show that the decay time of the impulse response of a plate loudspeaker can be reduced using these techniques without necessarily sacrificing bass response, giving better performance as a hi-fidelity loudspeaker. These systems and methods may, in some contexts, assume that a single driver on a plate is suitable for audio reproduction over the entire audio bandwidth, unlike cone loudspeakers, which typically require multiple drivers of various sizes.

Systems and methods of mechanically driving plates with different parameters based on frequency region in a way similar to typical cone driver crossover networks are described herein. These systems and methods may be implemented using arrays of independently controlled drivers, which allow a designer to emphasize or de-emphasize certain plate modes in certain frequency bands. Tuning the characteristics of the plate's motion can also affect the acoustical properties everywhere in the space into which the plate radiates sound rather than just at a single spatial location.

In one aspect of the disclosure, a method for controlling the performance of a plate loudspeaker is described. The method can include processing a signal into a plurality of sub-signals using a modal crossover network, wherein each sub-signal is associated with a frequency band; assigning each sub-signal to one or more of a plurality of drivers located on a plate of the plate loudspeaker and assigning a relative amplitude to each of the plurality of drivers, wherein the sub-signal and the relative amplitude assigned to each of the plurality of drivers is determined based at least on the location of the driver on the plate; routing each sub-signal to its assigned one or more plurality of drivers; and driving the plate loudspeaker with the plurality of drivers having received the routed sub-signals at the assigned relative amplitude.

The plurality of drivers can excite a plurality of modes in the plate loudspeaker. The plurality of drivers can be independently controlled. In one aspect, the plurality of drivers can be arranged periodically on the plate loudspeaker.

The separation of the signal into a plurality of frequency bands can be performed using a plurality of filters. For example, the plurality of filters can comprise a low-pass, a band-pass, and a high pass filter. Similarly, the plurality of filters can comprise analog, digital, or partially analog, partially digital filters.

The plurality of sub-signals can have different frequency domains and amplitudes over the frequency domain than the signal.

Assigning each sub-signal to one or more of a plurality of drivers located on a plate of the plate loudspeaker and assigning a relative amplitude to each of the plurality of drivers can further be based on one or more of the plate loudspeaker materials, the plate loudspeaker materials size, the number of the drivers, the arrangement of the drivers, and a listener's preferences.

In one aspect, the plate loudspeaker can comprise aluminum. In another aspect, the plate loudspeaker can comprise glass or other materials.

The plurality of drivers can comprise piezoelectric materials. For example, the piezoelectric materials can comprise ceramic. The plurality of drivers can comprise organic polymers. For example, the organic polymers comprise polyvinylidene fluoride (PVDF).

Moreover, the plurality of drivers can be electromagnetic coil drivers.

The signal can comprise a digital signal, an analog signal, or a partially digital, partially analog signal. The signal can be an audio signal. For example, the signal can be a pre-recorded signal, or it can be a live signal. The signal can comprise one or more of speech or music.

In another aspect, a plate loudspeaker is disclosed. The plate loudspeaker can comprise a modal crossover network, wherein the modal crossover network processes a signal into a plurality of sub-signals, each sub-signal associated with a frequency band; and a spatial filter, wherein the spatial filter assigns each sub-signal to one or more of a plurality of drivers located on a plate and assigns a relative amplitude to each of the plurality of drivers, wherein the sub-signal and the relative amplitude assigned to each of the plurality of drivers is determined based at least on a location of each of the plurality of drivers on the plate, and wherein each sub-signal is routed to its assigned one or more plurality of drivers through the modal crossover network and the plate loudspeaker is driven with the plurality of drivers having received the routed sub-signals at the assigned relative amplitude. The plate loudspeaker can further comprise one or more of the attributes described above.

In yet another aspect, a system is described. The system comprises a plate loudspeaker; and a transmitter for transmitting a signal to the plate loudspeaker. The plate loudspeaker comprises a modal crossover network, wherein the modal crossover network processes the signal into a plurality of sub-signals, each sub-signal associated with a frequency band; and a spatial filter, wherein the spatial filter assigns each sub-signal to one or more of a plurality of drivers located on a plate and assigns a relative amplitude to each of the plurality of drivers, wherein the sub-signal and the relative amplitude assigned to each of the plurality of drivers is determined based at least on a location of each of the plurality of drivers on the plate, and wherein each sub-signal is routed to its assigned one or more plurality of drivers through the modal crossover network and the plate loudspeaker is driven with the plurality of drivers having received the routed sub-signals at the assigned relative amplitude. The plate loudspeaker can further comprise one or more of the attributes described above.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The components in the drawings are not necessarily to scale relative to each other and like reference numerals designate corresponding parts throughout the several views.

DETAILED DESCRIPTION

Figure 1:
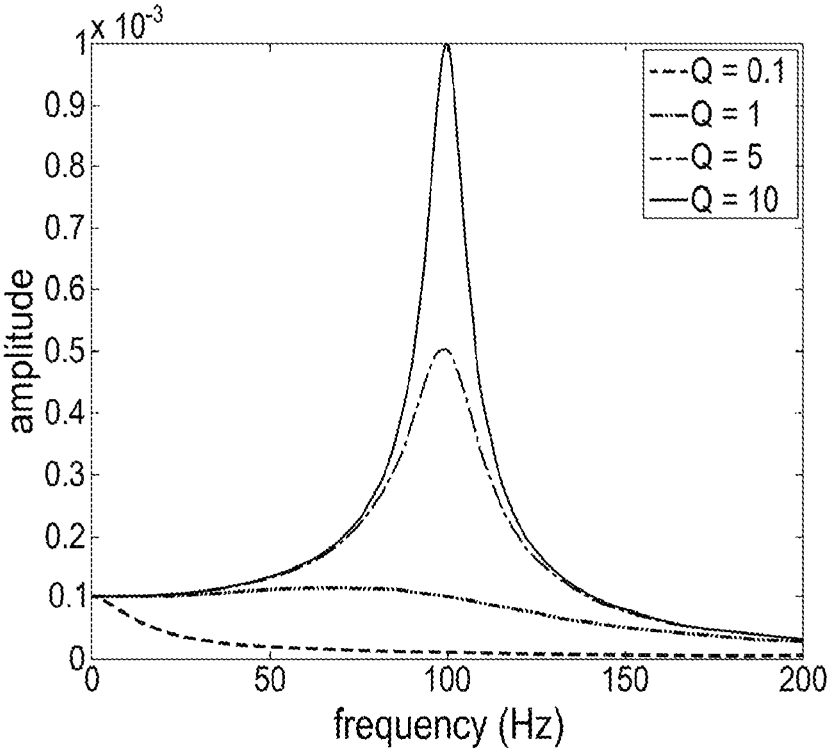
FIG. 1 shows the frequency response of a simple harmonic oscillator system with a resonant frequency of approximately 100 Hz and various Q values.

Unless defined otherwise, all technical and scientific terms used herein have the same meaning as commonly understood by one of ordinary skill in the art. Methods and materials similar or equivalent to those described herein can be used in the practice or testing of the present disclosure.

As used in the specification and the appended claims, the singular forms "a," "an" and "the" include plural referents unless the context clearly dictates otherwise. Ranges may be expressed herein as from “about” one particular value, and/or to “about” another particular value. When such a range is expressed, another embodiment includes from the one particular value and/or to the other particular value. Similarly, when values are expressed as approximations, by use of the antecedent “about,” it will be understood that the particular value forms another embodiment. It will be further understood that the endpoints of each of the ranges are significant both in relation to the other endpoint, and independently of the other endpoint.

“Optional” or “optionally” means that the subsequently described event or circumstance may or may not occur, and that the description includes instances where said event or circumstance occurs and instances where it does not.

Throughout the description and claims of this specification, the word “comprise” and variations of the word, such as “comprising” and “comprises,” means “including but not limited to,” and is not intended to exclude, for example, other additives, components, integers or steps. “Exemplary” means “an example of” and is not intended to convey an indication of a preferred or ideal embodiment. “Such as” is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Conventional cone loudspeakers can be difficult to integrate into thin, light electronics due at least to size and weight, a problem, which can be solved by using plates as loudspeakers. Despite the fact that the complex vibrational characteristics of plates can give them relatively omnidirectional and diffuse radiation patterns, phase (equivalently temporal) distortion can be problematic and an additional problem is that bass response can be weak and reverberant. These problems may not easily be fixed with equalization or inverse filtering due to the multiplicity of plate modes and the spatial variation of radiated sound by different plate modes. Phase distortion in audio reproduction can be important especially when it comes to speech. Clear reproduction of consonant sounds in speech can require that the loudspeaker have an impulse response that is short in time duration. Temporal distortions may be essentially impossible to fix in a practical way using inverse filtering techniques due to the dispersive nature of the plate radiation mechanisms.

By tuning the mechanical parameters of the plate to sound appropriate for certain audio bands, many of the challenges inherent with using plates as loudspeakers can be mitigated. This method may be essentially independent of the spatially diffuse nature of the acoustic radiation from a plate, so it can tune the response at nearly all points in space. Furthermore, the temporal distortion effects can be significantly reduced by not allowing rapid transients to excite the lowest modes.

In the first section of this disclosure, the mechanics and acoustics of simple plates with respect to arbitrary driving forces are derived as LTI systems, which can be interpreted with regards to audio signals. The second section of this disclosure describes the modal crossover network system as it relates to the properties derived in the previous section. The third section of this disclosure presents simulations of various crossover methods on an aluminum plate and an analysis of the systems and methods.

Plate Speaker Mechanics and Acoustics

The motion of a plate can be based on an infinite number of ‘modes,’ each mode having a spatial shape function, $z_S$, and a temporal function, $z_t$, which modulates the spatial shape. These functions can be separable and can form the solution to the wave equation for plates. The 2-dimensional modal shapes can be represented with indices, m and n, denoting the number of nodes plus one in the x and y direction, respectively. The complete expression for plate motion, z(x, y, t), can be based on the weighted sum of all modal functions, where A(m, n) is the relative amplitude of the (m, n) mode:

$$z(x, y, t) = \sum_{m=1}^{\infty}\sum_{n=1}^{\infty} A(m, n) z_S(m, n, x, y) z_t(m, n, t) \tag{1}$$

Plate motion with respect to a single mode may also be expressed as a function of frequency by using at the Fourier transform of each single mode time-dependent function, $z_\omega(m, n, \omega)=\mathcal{F}(z_t(m, n, t))$. The expression for plate motion with respect to frequency, z(x, y, ω), can be the weighted sum of spatial functions modulated with each mode’s frequency response:

$$z(x, y, \omega) = \sum_{m=1}^{\infty}\sum_{n=1}^{\infty} A(m, n) z_S(m, n, x, y) z_\omega(m, n, \omega) \tag{2}$$

For the case of a plate of dimensions $L_x$ by $L_y$ with simply supported boundary conditions, the spatial functions can take the form of two-dimensional sinusoids:

$$z_S(x, y, m, n) = \sin\left(\frac{m\pi x}{L_x}\right)\sin\left(\frac{n\pi y}{L_y}\right) \tag{3}$$

The frequency-domain characteristics of each mode can be governed by a resonant frequency, $\omega_0(m, n)$, and Quality factor, Q(m, n). The temporal portion of each mode function can behave like a simple harmonic oscillator or mass-spring-damper system. The resonant frequency of a plate mode can be calculated using Eq. 4, below, where E, ρ, and ν are the Young’s modulus, density and Poisson ratio of the material, respectively, and h is the plate thickness. The Q values can be determined experimentally and can depend on various characteristics of the material being used. Materials such as metal can have high Q values, whereas rubber or paperboard can have lower Q values.

$$\omega_0(m, n) = \sqrt{\frac{Eh^2}{12\rho(1-\nu^2)}}\left(\left(\frac{m\pi}{L_x}\right)^2 + \left(\frac{n\pi}{L_y}\right)^2\right) \tag{4}$$

Figure 2:
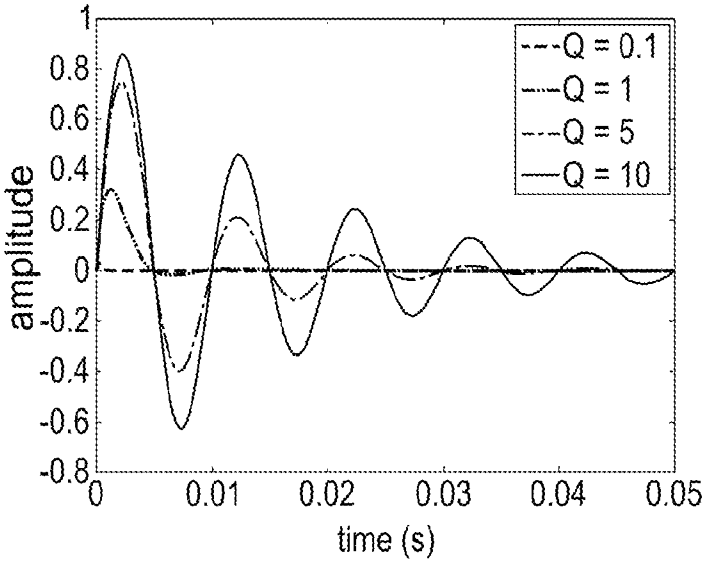
FIG. 2 shows the impulse response of a simple harmonic oscillator system with a resonant frequency of approximately 100 Hz and various Q values. Line patterns correspond to those in FIG. 1.

Each mode's frequency response consists of a peak at the resonant frequency with a width determined by the Q value, as shown in FIG. 1. Because the panel's motion can be made up of an infinite number of modes, the frequency response can be made up from a sum of all modes' frequency response curves. Correspondingly, each mode's impulse response can be a decaying sinusoidal function, with a time constant relative to the Q factor and the resonant frequency, $$\tau_{mn} = \frac{1}{2Q(n, m)\omega_0(n, m)},$$

as shown in FIG. 2. Assuming the Q value is the same for each mode, the lower frequencies can exhibit much longer decay times.

Figure 3:
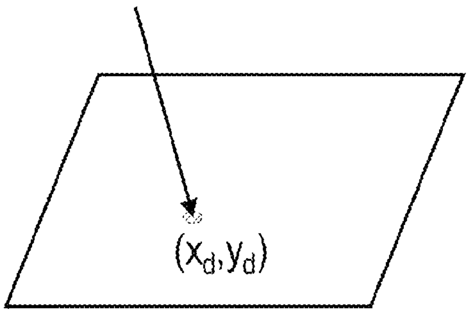
FIG. 3 shows a plate with a single driving force at $(x_d, y_d)$.

It may not be practical to discuss the mechanics of a plate without referring to the forces on the plate, as driving all of the modes equally can be impractical. FIG. 3 shows a plate with a single localized driving force on its surface. The amount that a force contributes to each mode, A(m, n), can depend on its location relative to the mode shape, as in Eq. 5. Under the assumption of simply supported boundary conditions and point forces, the expression can be greatly simplified to Eq. 6:

$$A(x_d, y_d, m, n) = \int_S z_S(x, y, m, n)\delta(x - x_d)\delta(y - y_d)dS \tag{5}$$

$$A(x_d, y_d, m, n) = \sin\left(\frac{m\pi x_d}{L_x}\right)\sin\left(\frac{n\pi y_d}{L_y}\right) \tag{6}$$

Figure 4:
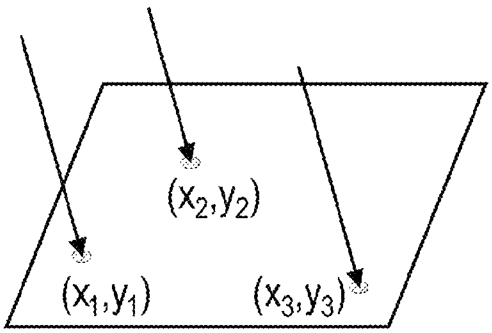
FIG. 4 shows a plate with 3 driving forces at indexed locations.

The process can be similar for multiple drivers at indexed locations ($l_1, l_2, \ldots, l_L$), shown in FIG. 4 with L=3. The modal contribution factors can be the sum of all drivers' contributions to the respective mode, as in Eq. 7. The drivers may be driven with different amplitudes, and the amplitude of each driver can be denoted $d_k$, and may be either positive or negative:

$$A_{mn}\left(\sum l, m, n\right) = \sum_{k=1}^{L} d_k \sin\left(\frac{m\pi x(l_k)}{L_x}\right)\sin\left(\frac{n\pi y(l_k)}{L_y}\right) \tag{7}$$

The overall mechanical response of the plate to any number of drivers may be written as a sum of all modal responses weighted by the modal contributions of the drivers, either temporally (Eq. 8) or in terms of frequency (Eq. 9):

$$z(x, y, t) = \sum_{m=1}^{\infty}\sum_{n=1}^{\infty} A_{mn}\left(\sum l, m, n\right) z_S(m, n, x, y) z_t(m, n, t) \tag{8}$$

$$z(x, y, \omega) = \sum_{m=1}^{\infty}\sum_{n=1}^{\infty} A_{mn}\left(\sum l, m, n\right) z_S(m, n, x, y) z_\omega(m, n, \omega) \tag{9}$$

In one aspect of the disclosure, the plurality of drivers can excite a plurality of modes in the plate loudspeaker. Moreover, the plurality of drivers can be independently controlled. The plurality of drivers can be arranged periodically or in any order on the plate loudspeaker.

1.1 Modal Acceleration

In the next section of this disclosure, the acoustic radiation of a vibrating plate is evaluated. This expression can be based on each mode's acceleration rather than displacement, which can be easily evaluated from the equations in the previous sections. Eqs. 10 and 11 give the modal plate acceleration as a function of space and either time or frequency:

$$\ddot{z}(m, n, t) = \omega_0^2(m, n) A_{mn}\left(\sum l, m, n\right) z_t(m, n, t) \tag{10}$$

$$\ddot{z}(m, n, \omega) = \omega^2 A_{mn}\left(\sum l, m, n\right) z_\omega(m, n, \omega) \tag{11}$$

1.2 Modal Acoustic Transfer Functions

The acoustic radiation from a plate can be a complex phenomenon that may be expressed in terms of space, time, and frequency. For the acoustic radiation at a single point in space for either all time or all frequencies, similar to the standard loudspeaker measurement technique using a microphone placed 1 meter away.

Acoustic radiation may be expressed for any arbitrary instantaneous acceleration distribution via the Rayleigh Integral, Eq. 12, with $R=\sqrt{(x-x')^2+(y-y')^2+z'^2}$, with (x, y) being the location on the plate and (x', y', z') being the measurement location:

$$h(m, n, x', y', z', t) = \rho_0 \int_S \frac{z_S(m, n, x, y) z_T\left(t - \frac{R}{c_0}\right)}{2\pi R} \tag{12}$$

$$h(m, n, x', y', z', t) = \rho_0 \int_S \frac{z_S(m, n, x, y)\delta\left(t - \frac{R}{c_0}\right)}{2\pi R} \tag{13}$$

Assuming that the temporal portion, $z_T$, of Eq. 12 is a delta function as in Eq. 13, each acoustic equation represents an LTI system that can be convolved with the mechanical LTI functions from Eq. 10. Adding the combined mechanical-acoustical functions for each mode together can give the complete impulse response of a plate as a microphone would measure, as in Eq. 14:

$$p(x', y', z', t) = \sum_{n=1}^{\infty}\sum_{m=1}^{\infty} \ddot{z}(m, n, t) * h(m, n, x', y', z', t) \tag{14}$$

2 Modal Crossover Networks

The analysis of plate loudspeakers can be performed in terms of the way individual drivers interact with the plate. However, it is also possible to define "modal drivers," which are a linear combination of the actual drivers. These modal drivers can act as independent loudspeakers, and can be subjected to the same design process as a conventional loudspeaker that uses a woofer, midrange and tweeter, for example.

2.1 Spatial Filtering

Assume a plate having a surface covered with an array of L drivers at indexed locations (1, 2, . . . , L), such that the first driver is at location ($x_1$, $y_1$) and the last driver is at location ($x_L$, $y_L$). The driver amplitudes may be denoted ($d_1$, $d_2$, . . . , $d_L$).

The amplitude of the modal shapes, $z_S$(m, n, x, y), may be discretized according to index point rather than spatial location as $[M_{nm}(1), M_{nm}(2), \ldots, M_{nm}(L)]$. The array of modal contributions or modal driver amplitudes, A, can be calculated from the actual driver amplitudes, D, by multiplying by the matrix of indexed modal shapes.

$$\begin{bmatrix} A_1 \\ A_2 \\ \vdots \\ A_{mn} \end{bmatrix} = \begin{bmatrix} M_{11}(1), M_{11}(2), \ldots, M_{11}(L) \\ M_{12}(1), M_{12}(2), \ldots, M_{12}(L) \\ \vdots \\ M_{mn}(1), M_{mn}(2), \ldots, M_{mn}(L) \end{bmatrix} \begin{bmatrix} d_1 \\ d_2 \\ \vdots \\ d_L \end{bmatrix} \tag{15}$$

$$A = MD \tag{16}$$

The actual driver amplitudes may be determined from the vector of modal driver amplitudes as well.

$$D = M^{-1}A \tag{17}$$

This may require that M be a square matrix, or that the number of drivers be equal to the number of modes that are being controlled. By using a regularly spaced rectangular array, the modes that are controlled can match the driver spacing. For an array of n×m drivers, the modes that can be controlled can be represented as (1, 1) through (n, m). This may be regarded as the spatial version of the Nyquist sampling theorem.

The individual driver amplitudes may now be derived to specify the amplitudes of certain modes. For example, the lowest mode may be loud but extremely resonant, and may be a poor choice for audio reproduction. Using Eq. 17, the driver amplitudes may be configured to play audio through a higher-order mode or a combination of the other modes at specified amplitudes. The spatial filtering can take different forms depending on plate materials, size, and the number of drivers, in addition to, for example, a listener's personal preference.

The fact that the modal amplitude matrix M may need to be truncated can mean that creating modal drivers using actual drivers can create 'spillover' into high-order, uncontrolled modes. The amplitude that all modes are driven, $A_{ex}$, may be calculated by using an untruncated matrix of $(n_{ex}, m_{ex})$ modal amplitudes $M_{ex}$.

$$A_{ex} = M_{ex}(M^{-1}A) \tag{18}$$

2.2 Crossover Networks for Spatial Filters

The mechanical and acoustical properties of certain modes may not apply equally to all frequency bands in terms of audio fidelity. Bass frequencies can require higher amplitudes for human listeners and can possibly tolerate more reverberation, naturally lending them to the lower modes. Higher frequencies in speech and music can contain rapid onset events and may not require as much amplitude as the lower frequencies, lending them to higher modes. A rapid onset event in high frequencies can cause the low modes to ring, meaning that they may need to be entirely filtered out of the drive signals applied to the lower modes.

Figure 6:
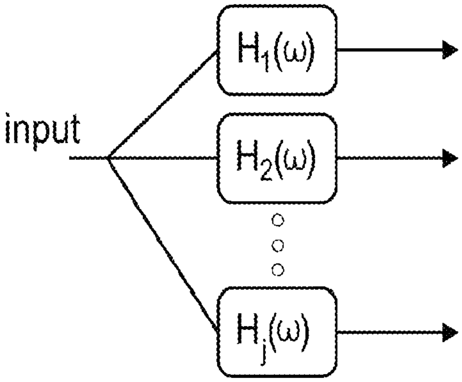
FIG. 6 shows the frequency crossover network block diagram.

The signal can be filtered into j bands by means of filters $H_1(\omega), H_2(\omega), \ldots, H_j(\omega)$, as represented by FIG. 6. In one aspect of the disclosure, the signal can include a digital signal, an analog signal, or a partially digital, partially analog signal. Moreover, the signal can be an audio signal. The signal can be pre-recorded or live. The signal can include, but is not limited to, speech and music.

Each signal, after filtering, can be spatially filtered into modal drivers by means of the modal vector for that frequency band $A_j$. The frequency-dependent vector of modal driver amplitudes, $A_x(\omega)$, is the sum of all j frequency bands played through their respective modal drivers. The signals played through the actual drivers can be a sum of the spatial filters over all frequency bands for that single driver.

$$A_x(\omega) = \sum_{j=1}^{J} A_j H_j(\omega) \tag{19}$$

$$D_x(\omega) = M^{-1}A_x(\omega) = M^{-1}\sum_{j=1}^{J} A_j H_j(\omega) \tag{20}$$

By substituting the crossover modal driver amplitudes into eq. 14, the mechanical-acoustical properties of the loudspeaker may be simulated.

Frequency band separation can also help considerably with the modal spillover factors introduced in the previous section. Playing low frequencies through low modes can spill over into higher modes due to spatial aliasing, but if the driver spacing is fine enough, the high frequency audio components can be removed so modal spillover is of no practical consequence, i.e., even though the transducer array may unintentionally excite higher modes, if the high frequency components of the signal are removed then there may not be any significant production of audio arising from spillover.

In one aspect of the disclosure, processing a signal into a plurality of sub-signals can include separating the signal into a plurality of frequency bands. The sub-signals can have different frequency domains and amplitudes over the frequency domain than the signal. Separating the signal into a plurality of frequency bands can be done, for example, with filters. The filters can include, for example, low-pass, band-pass, and high pass filters. The filters can include analog, digital, or partially analog, partially digital filters and components. Moreover, processing the signal can include spatially filtering the signal. Processing the signal can, for example, be based on (but not limited to) the plate loudspeaker materials, the plate loudspeaker materials size, the number of the drivers, the arrangement of the drivers, and a listener's preferences, among other factors.

2.3 Simulations of Modal Crossover Implementation

Figure 5:
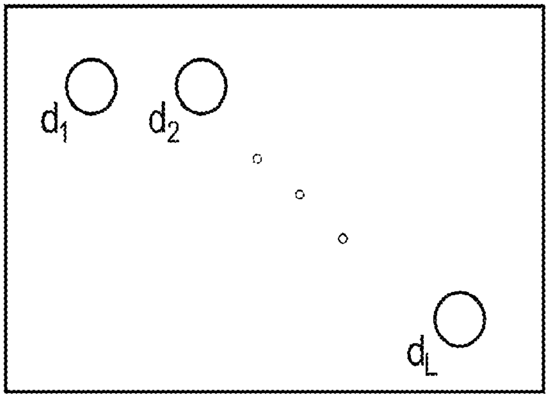
FIG. 5 shows a plate with a regularly spaced rectangular array of drivers at indexed locations.

The simulations performed here are based on an aluminum panel with dimensions approximately 1 m×approximately 0.7 m×approximately 1 mm where the Q is assumed to be 10 for every mode. It is to be appreciated; however, that embodiments of the invention contemplate that the panel can be comprised of other materials such as glass, wood, plastics, both ferrous and non-ferrous metals, combinations thereof, and the like, and can have any dimension or shape. The panel can be covered with an array of about 5×3 regularly spaced, ideal, massless point source drivers. The simulations can be performed with respect to a microphone placed approximately 1 meter away on the center axis of the speaker. A dual-band crossover network can be introduced with a crossover frequency of approximately 800 Hz. The equivalent measurement setup that is being simulated is shown in FIG. 5.

Figure 7:
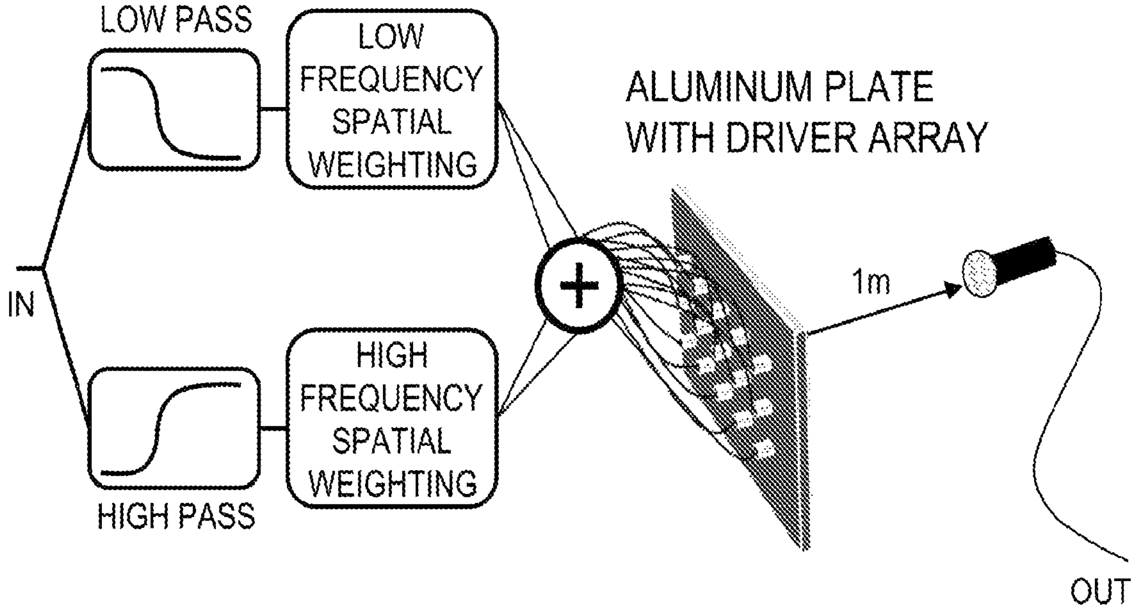
FIG. 7 shows an example simulation setup. The input in this example is an impulse, which can be first separated into low and high frequency bands with a crossover frequency of approximately 800 Hz. Spatial weighting filters, shown in the following figures, can be used to adjust the frequency and impulse response characteristics produced by the panel with the driver array as would be measured by a microphone approximately 1 m away.
Figure 8A:
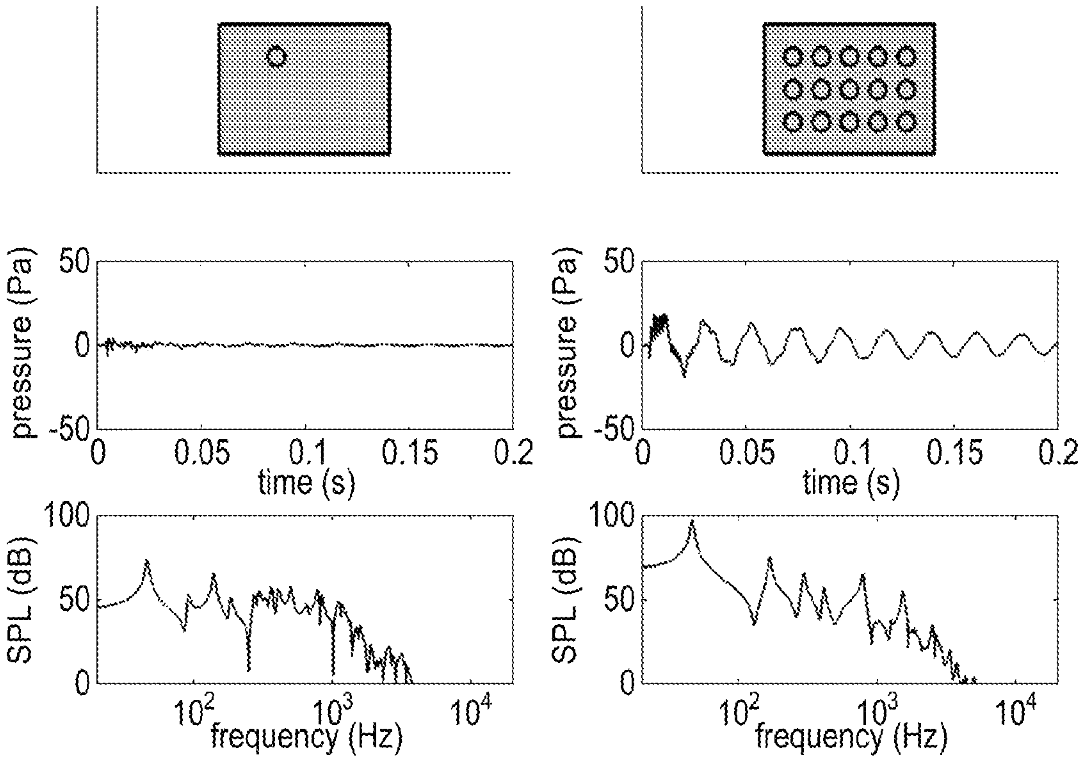
FIGS. 8A and 8B show the simulations of bass frequency driving with a single driver (top left), a uniform driver array (top right), and two arbitrary modal layouts (bottom). The uniform driver array shows a strong peak at the resonant frequency of the first mode and the reverberation at this frequency is clearly visible in the impulse response. The legend to the left denotes the method of representing driver amplitudes in the above pictures.
Figure 8B:
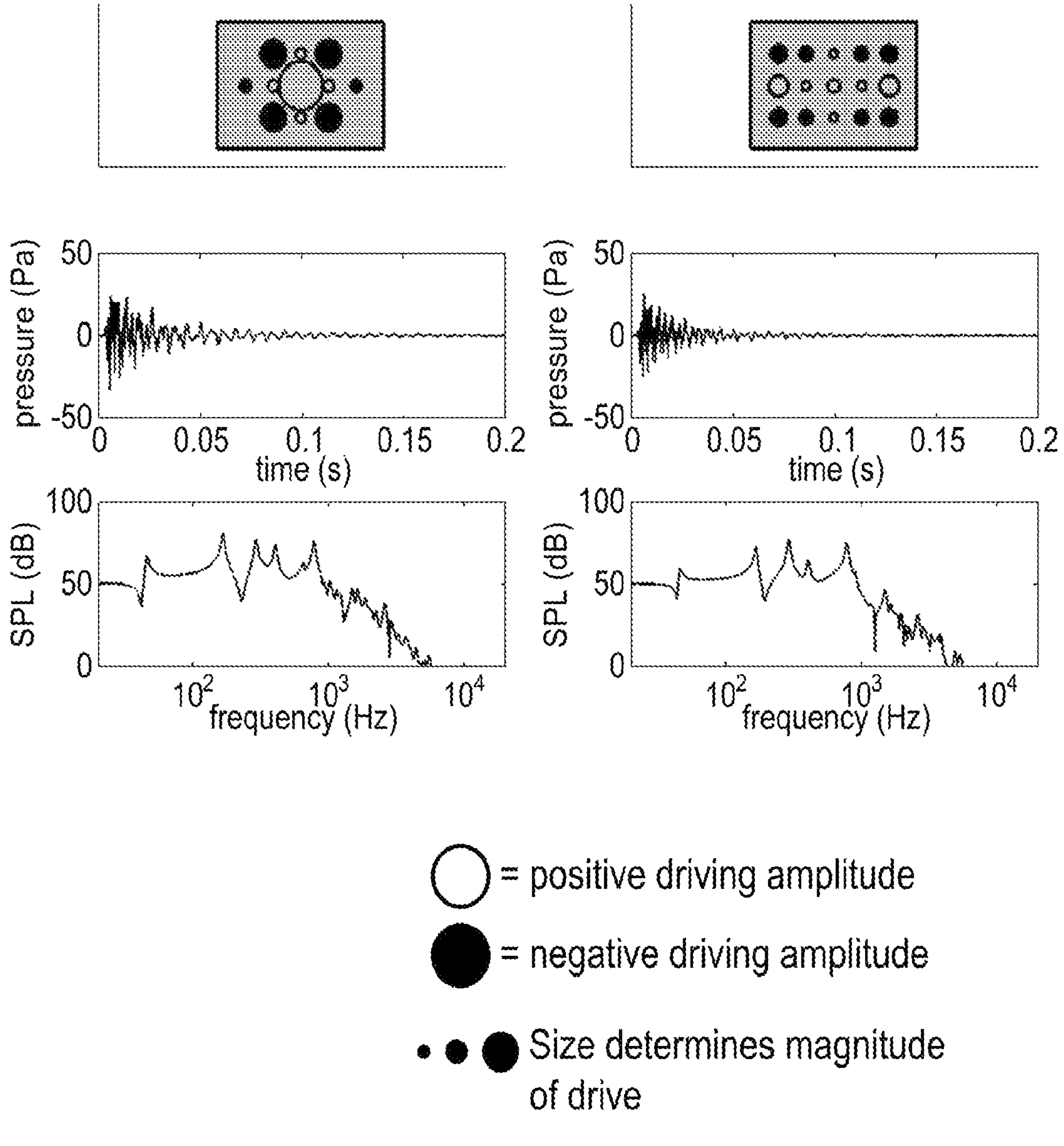
Figure 9:
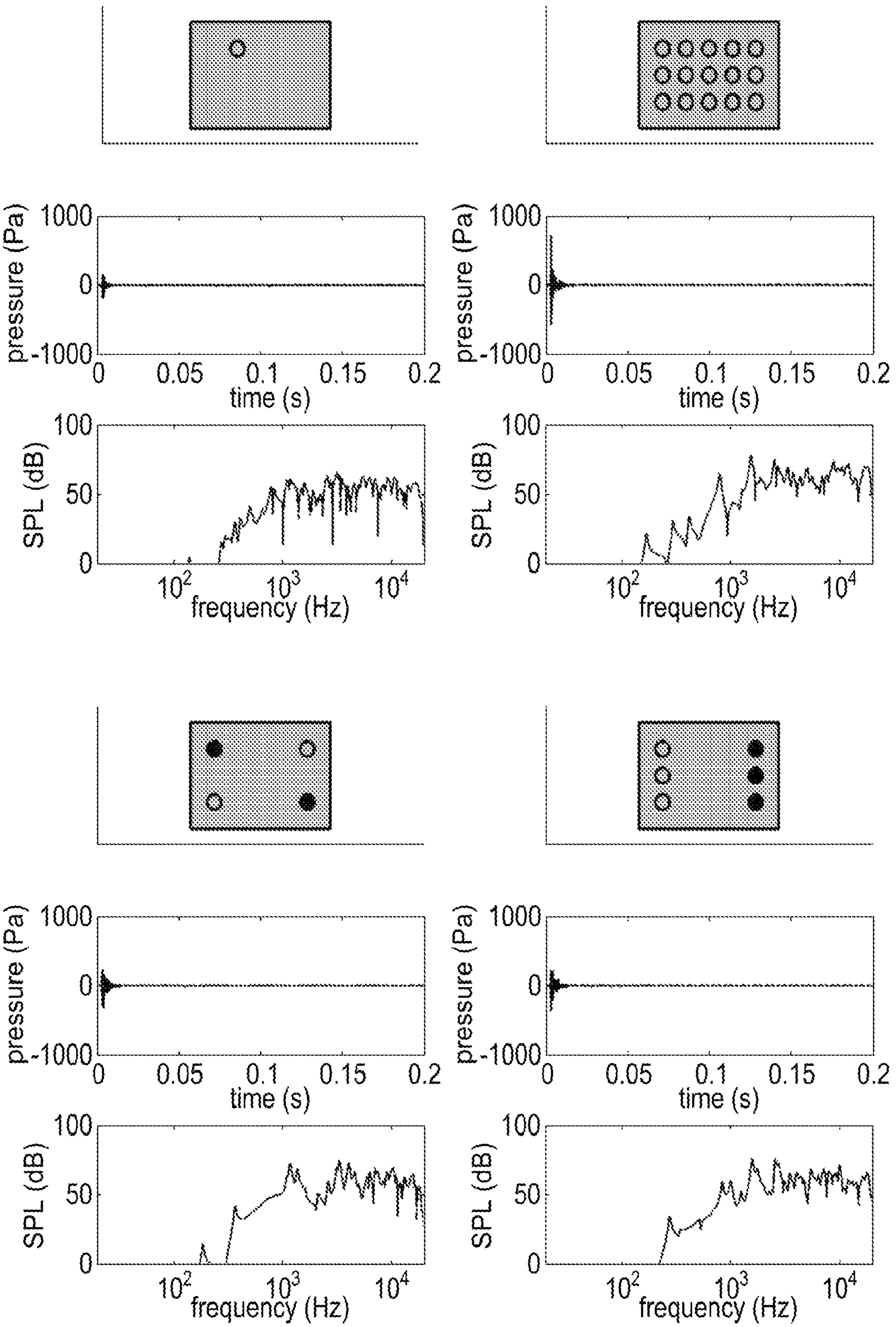
FIG. 9 shows treble frequency driving layout responses, including a single driver (top left) and a uniform array (top right). Also shown are two arbitrary modal layouts (bottom). Treble frequencies can occur where the density of modes is high and the layout may be not as critical as for bass frequencies, making the choice of driver layout less critical than for bass frequencies.
Figure 10:
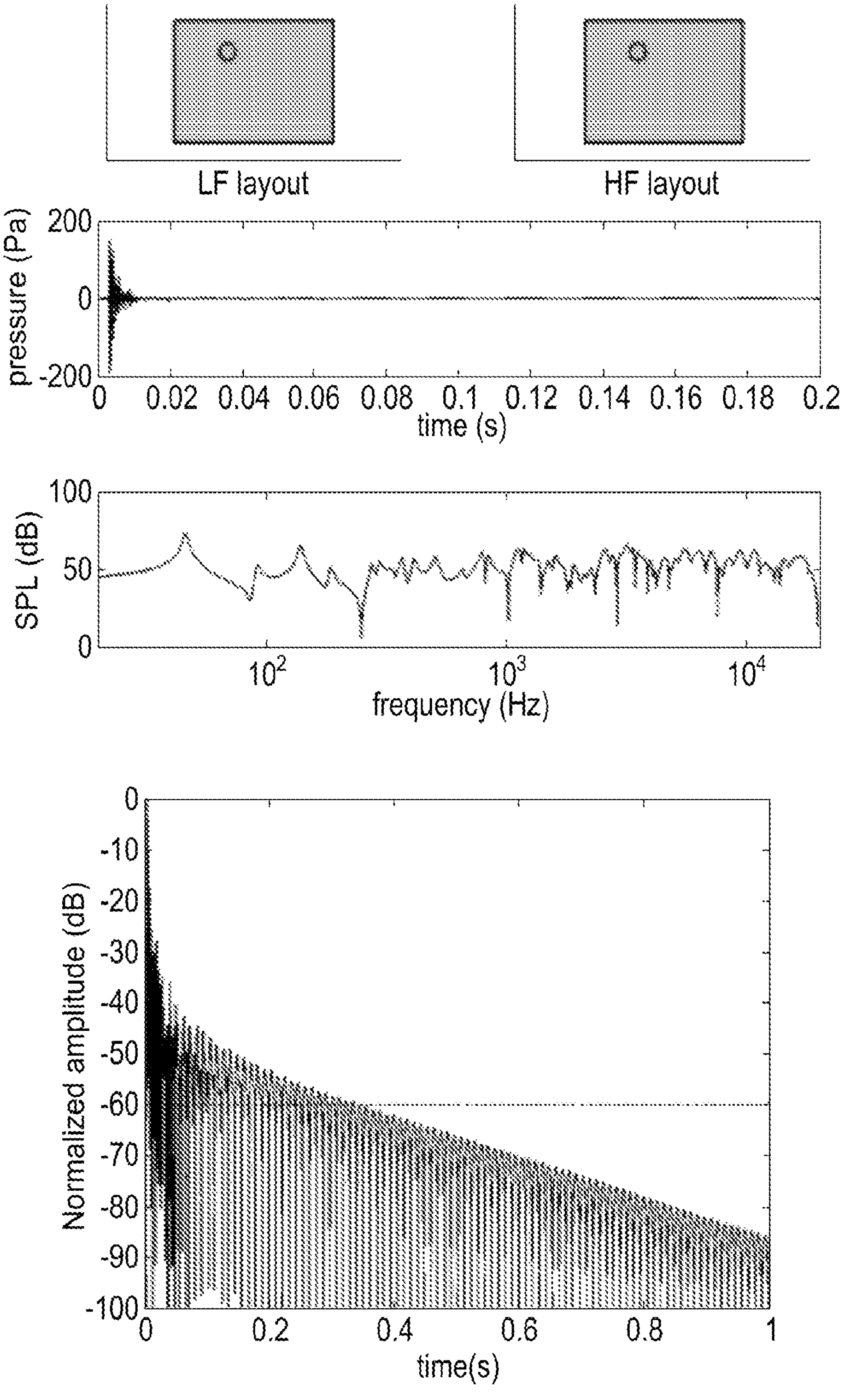
FIG. 10 shows a simulation of the acoustic properties of a plate loudspeaker with a single off-center driver. The $T_{60}$ time (right) is dominated by the lowest mode at approximately 0.35 s.
Figure 11:
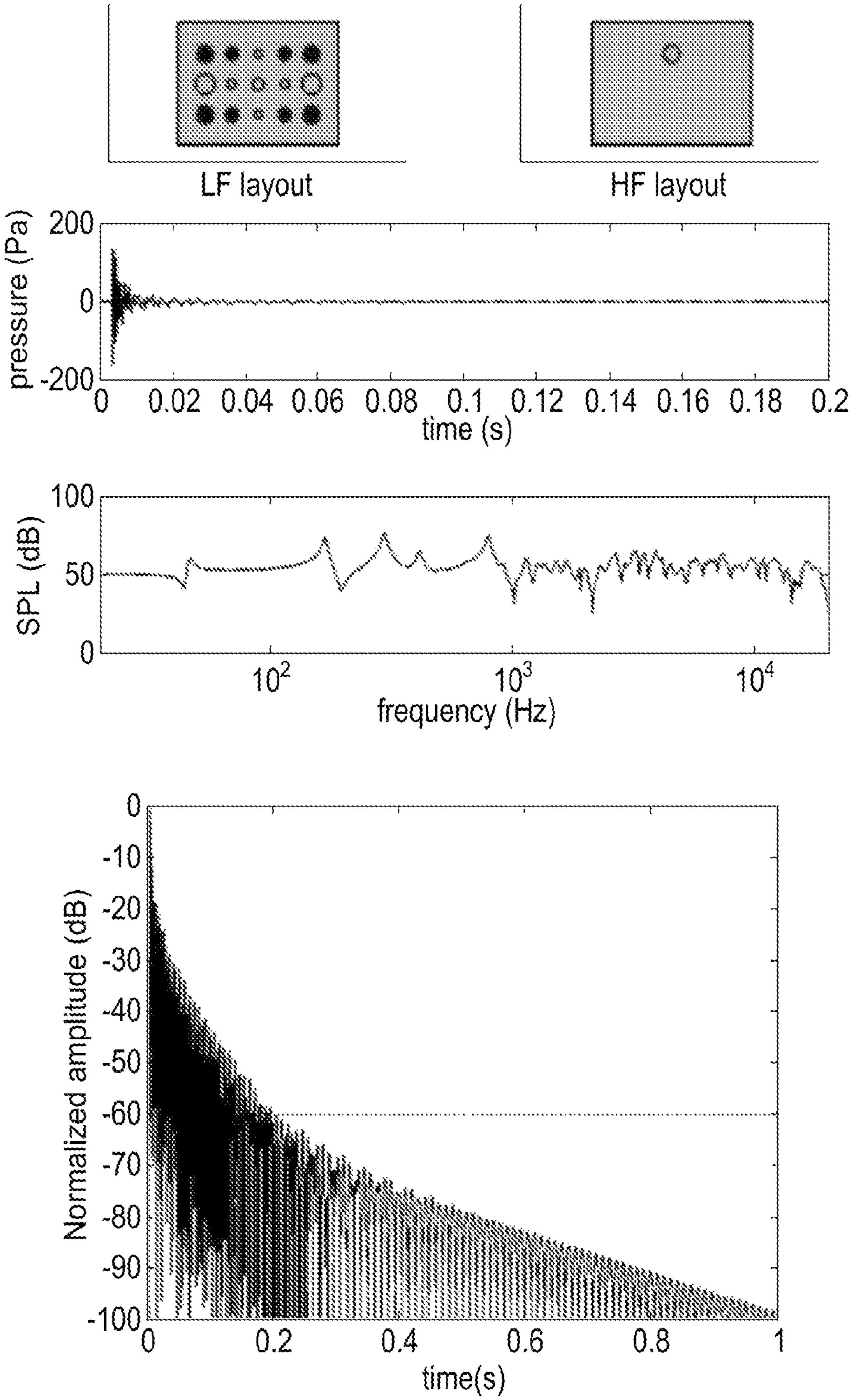
FIG. 11 shows a simulation of the acoustic properties of a plate loudspeaker utilizing modal crossover techniques. The frequency response remains nearly as flat as in FIG. 11 but the $T_{60}$ time has been greatly reduced to approximately 0.2 s by tuning the contributions of the lowest modes.

The impulse and frequency response characteristics produced by several bass frequency band-driving layouts are shown in FIG. 6, neglecting any contributions from the treble band. In FIG. 7, the same scheme is performed for only the treble band. Both bands can then be combined to give overall impulse and frequency response characteristics in FIGS. 8A and 8B, illustrating the flexibility in driving regimes by combining various layouts. The log of the absolute value of the impulse response for 2 combined layouts is also shown, illustrating the ability to reduce decay times by emphasizing certain modes.

CONCLUSION

In summary, systems and methods have been disclosed for controlling the performance of a plate loudspeaker. The method can include: receiving a signal by a receiver; processing the signal into a plurality of sub-signals; routing the sub-signals to a plurality of drivers using a modal crossover network; and driving the plate loudspeaker with the plurality of drivers having received the routed sub-signals. The system can include a receiver, a plurality of filters, a processor, a plurality of drivers, and a plate loudspeaker. The receiver receives a signal; the plurality of filters and processor process the signal into a plurality of sub-signals; the plurality of filters and processor route the sub-signals to a plurality of drivers using a modal crossover network; the plurality of drivers, having received the routed sub-signals, drive the plate loudspeaker. Similarly, the system can be comprised of a transmitter and a plate loudspeaker, where the plate loudspeaker comprises a modal crossover network, wherein the modal crossover network processes the signal into a plurality of sub-signals, each sub-signal associated with a frequency band; and a spatial filter, wherein the spatial filter assigns each sub-signal to one or more of a plurality of drivers located on a plate and assigns a relative amplitude to each of the plurality of drivers, wherein the sub-signal and the relative amplitude assigned to each of the plurality of drivers is determined based at least on a location of each of the plurality of drivers on the plate, and wherein each sub-signal is routed to its assigned one or more plurality of drivers through the modal crossover network and the plate loudspeaker is driven with the plurality of drivers having received the routed sub-signals at the assigned relative amplitude.

Plate loudspeakers can benefit from the fact that small drivers can actuate a large plate into radiating acoustic energy efficiently. The plate loudspeaker can be made partially or fully from aluminum, glass, wood, plastics, both ferrous and non-ferrous metals, combinations thereof, and the like. The drivers can be made partially or fully from piezoelectric materials, including ceramic. They can additionally be partially or fully made of organic polymers. The organic polymers can include polyvinylidene fluoride (PVDF), and other polymers. Moreover, the drivers can be electromagnetic coil drivers.

Though the systems and method described herein may require more drivers and signal processing hardware, the algorithms can be simple enough so that a modest signal processing circuit can suffice.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. For example, the order of passing the audio signal through the modal crossover network and through a bank of equalization filters can be interchanged without consequence. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method for controlling the performance of a plate loudspeaker, the method comprising:

processing a signal into a plurality of sub-signals using a modal crossover network, wherein each sub-signal is associated with a frequency band;

assigning each sub-signal to one or more of a plurality of drivers located on a plate and assigning a relative amplitude to each of the plurality of drivers, wherein the sub-signal and the relative amplitude assigned to each of the plurality of drivers is determined based at least on the location of the driver on the plate, and wherein the plate is driven to modes of motion by the plurality of drivers to generate the sound output of the plate loudspeaker, wherein each mode has a spatial shape function and a temporal function which modulates the spatial shape;

routing each sub-signal to its assigned one or more plurality of drivers; and driving the plate with the plurality of drivers having received the routed sub-signals at the assigned relative amplitude, wherein the modes of motion of the plate generate the sound output of the plate loudspeaker.

2. The method of claim 1, wherein the plurality of drivers excite a plurality of modes in the plate.

3. The method of claim 1, wherein the plurality of drivers are independently controlled.

4. The method of claim 1, wherein the plurality of drivers are arranged periodically on the plate.

5. The method of claim 1, wherein the step of processing the signal into the plurality of sub-signals comprises separating the signal into a plurality of frequency bands using a plurality of filters.

6. The method of claim 5, wherein the plurality of filters is selected from the group consisting of a low-pass, a band-pass, and a high pass filter.

7. The method of claim 5, wherein the plurality of filters is selected from the group consisting of analog filters, digital filters, and a combination of partially analog and partially digital filters.

8. The method of claim 1, wherein the plurality of sub-signals have different frequency domains and amplitudes over the frequency domain than the signal.

9. The method of claim 1, wherein the step of assigning each sub-signal to the plurality of drivers located on the plate and the step of assigning the relative amplitude to each of the plurality of drivers are performed via processing that use information selected from the group consisting of materials of the plate, size of the plate, number of the plurality of drivers located on the plate, arrangement of the plurality of drivers on the plate, and a listener's preferences.

10. The method of claim 1, wherein the plate comprises aluminum or glass.

11. The method of claim 1, wherein the plurality of drivers comprise piezoelectric materials or organic polymers.

12. The method of claim 11, wherein the piezoelectric materials comprise ceramic.

13. The method of claim 11, wherein the organic polymers comprise polyvinylidene fluoride (PVDF).

14. The method of claim 1, wherein the signal comprises at least one of a digital signal, an analog signal, or a combination of partially digital and partially analog signal.

15. The method of claim 1, wherein the signal is an audio signal selected from the group consisting of speech and music.

16. The method of claim 1, wherein the signal is pre-recorded or live.

17. The method of claim 1, wherein at least a portion of the plurality of drivers comprise electromagnetic coil drivers.

18. The method of claim 1, wherein the drivers are force drivers that drive bending modes of the plate.

19. A plate loudspeaker comprising:

a modal crossover network, wherein the modal crossover network processes a signal into a plurality of sub-signals, each sub-signal associated with a frequency band;

a spatial filter, wherein the spatial filter assigns each sub-signal to a plurality of drivers located on a plate and assigns a relative amplitude to each of the plurality of drivers, wherein the plate is driven to modes of motion by the plurality of drivers to generate the sound output of the plate loudspeaker, wherein each mode has a spatial shape function and a temporal function which modulates the spatial shape, and wherein the sub-signal and the relative amplitude assigned to each of the plurality of drivers is determined based at least on a location of each of the plurality of drivers on the plate, and wherein each sub-signal is routed to its assigned one or more plurality of drivers through the modal crossover network and the plate loudspeaker is driven with the plurality of drivers having received the routed sub-signals at the assigned relative amplitude.

20. The plate loudspeaker of claim 19, wherein the plurality of drivers excite a plurality of modes in the plate, wherein the plurality of drivers are independently controlled, wherein the plurality of drivers are arranged periodically on the plate, and wherein the modal crossover network comprises a plurality of filters, wherein the plurality of filters comprise a low-pass, band-pass, and high pass filter, and wherein the plurality of filters comprise analog, digital, or a combination of partially analog and partially digital filters.

21. A system comprising:

a plate loudspeaker; and a transmitter for transmitting a signal to the plate loudspeaker, wherein the plate loudspeaker comprises:

a modal crossover network, wherein the modal crossover network is configured to process the signal into a plurality of sub-signals, each sub-signal associated with a frequency band; and a spatial filter, wherein the spatial filter is configured to assign each sub-signal to a plurality of drivers located on a plate and assigns a relative amplitude to each of the plurality of drivers, wherein the plate is driven to modes of motion by the plurality of drivers to generate the sound output of the plate loudspeaker, wherein each mode has a spatial shape function and a temporal function which modulates the spatial shape, and wherein the sub-signal and the relative amplitude assigned to each of the plurality of drivers are determined based at least on a location of each of the plurality of drivers on the plate, wherein each sub-signal is routed to its assigned one or more plurality of drivers through the modal crossover network, and wherein the plate is driven with the plurality of drivers having received the routed sub-signals at the assigned relative amplitude.

* * * * *